United States Patent [19]

Read

[11] 4,295,179
[45] Oct. 13, 1981

[54] ELECTRIC TEST EQUIPMENT HOUSING

[75] Inventor: Clifford D. Read, Almonte, Canada

[73] Assignee: Northern Telecom Limited, Montreal, Canada

[21] Appl. No.: 104,869

[22] Filed: Dec. 18, 1979

[51] Int. Cl.³ .............................................. H05K 5/06
[52] U.S. Cl. ..................... 361/331; 174/52 R; 220/4 B; 206/523; 361/399
[58] Field of Search ............ 174/52 R; 361/331, 334, 361/358, 360, 362, 380, 390–395, 399, 428, 365, 364, 371; 220/4 B, 4 E, 444; 206/523; 211/41

[56] References Cited

U.S. PATENT DOCUMENTS

| | | | |
|---|---|---|---|
| 3,341,268 | 9/1967 | Bickford | 361/364 |
| 3,526,813 | 9/1970 | Kobryner | 361/364 |
| 3,628,096 | 12/1971 | Drew, Jr. | 361/369 |
| 3,753,047 | 8/1973 | Shalbetter | 361/364 |
| 3,912,107 | 10/1975 | Baumann | 220/444 |
| 3,948,436 | 4/1976 | Bambara | 206/523 |
| 4,149,741 | 4/1979 | Lipscomb | 361/369 |

FOREIGN PATENT DOCUMENTS 2112816  6/1972  France .............................. 206/523

*Primary Examiner*—Gerald P. Tolin
*Attorney, Agent, or Firm*—R. J. Austin

[57] ABSTRACT

A waterproof housing for electrical or electronic test equipment with an opening at the rear for equipment and having a flap at the front, the flap hinged upwardly to open and close an aperture for operating or viewing instruments of the equipment. Ideally, two identical housings may be joined rear-to-rear to form an assembly with a partition between them to close the openings and seal equipment inside one of the housings. Movement of the flap is desirably frictionally resisted to allow it to be located in any desired position. With the flap closed, a gap is formed between flap and housing for passage of wiring from the equipment. Preferably, the housing has inner and outer skin layers which are relatively resiliently movable and a compressible foam may be between skin layers.

12 Claims, 8 Drawing Figures

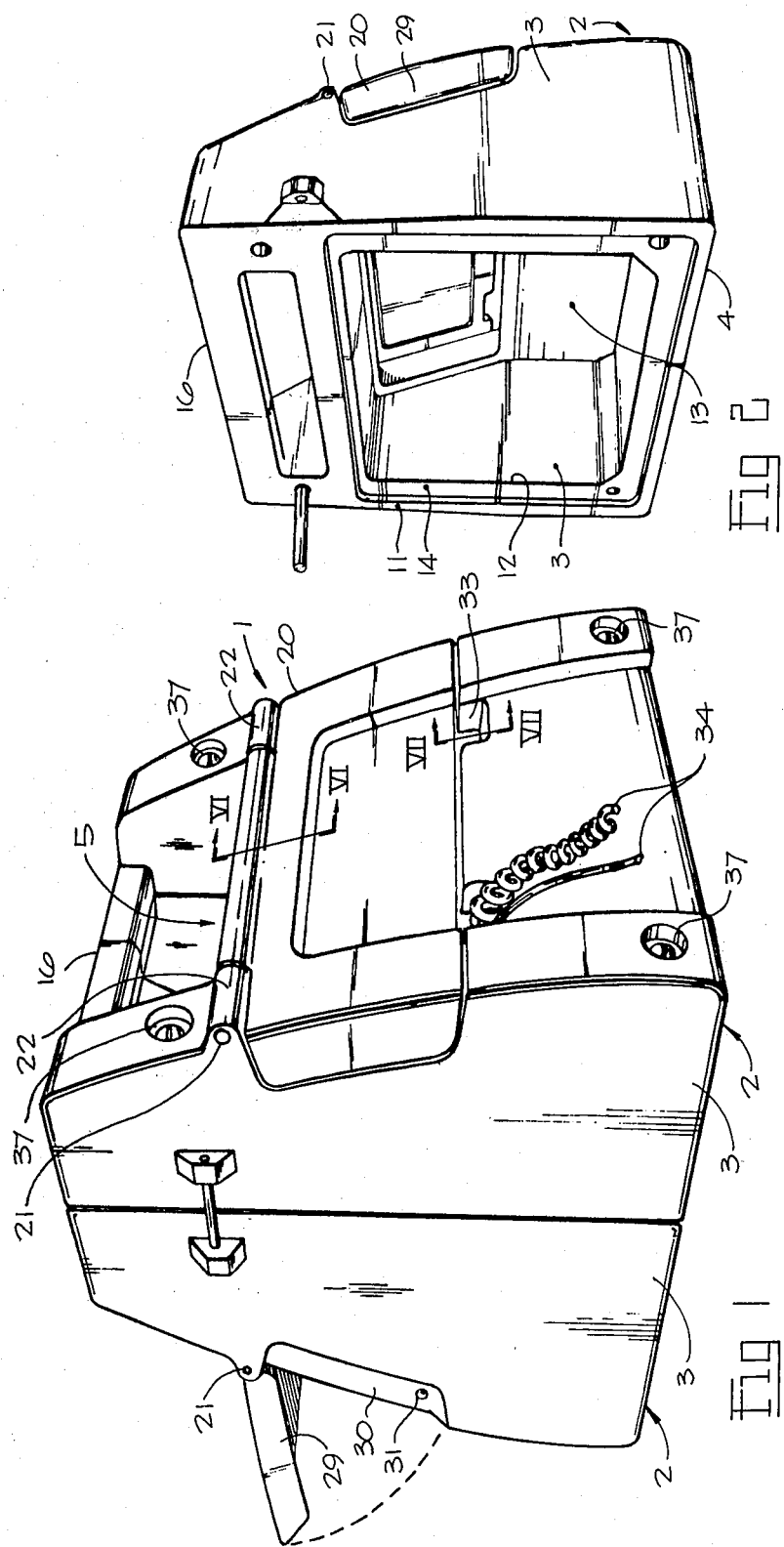

ELECTRIC TEST EQUIPMENT HOUSING

This invention relates to housing for electrical or electronic test equipment.

Electrical or electronic test equipment is provided for use by telecommunications linesmen and for use for testing power cables. As the equipment is used in the field for a high percentage of the time, it is likely to be subjected to all weather conditions. Conventionally, such equipment is housed in a metal box and is secured in place and lidded. Although it is known that the equipment will unavoidably be subjected to extremes of weather, the conventional housing constructions are completely unsuitable for affording necessary protection to the equipment. The lid needs to be open during use of the equipment during testing and this results in rain entering the housing with deleterious effects. Firstly any rain entering the housing may affect the equipment directly and, secondly, water collects in the housing to create constant dampness. As a result, it is known from experience that very expensive equipment housed in this manner becomes operationally useless within a very few weeks.

According to one aspect of the present invention, there is provided a housing for electrical or electronic test equipment, the housing being made from waterproof material and defining a chamber for containing the equipment, the housing comprising a closed top, two sidewalls and a base, a rear defining an opening to admit the equipment into the chamber, and a front wall defining an aperture to the chamber and having a flap for closing the aperture, the flap being connected to the front wall by a hinge for upward hinging movement of the flap and away from the aperture.

In a preferred arrangement, the hinge offers frictional resistance to movement of the flap to enable the flap to be located in any pivotal position. Thus, the flap may be positioned to prevent entry of rain into the housing and also act as shade for any instruments framed within the aperture so as to assist in their readability.

It is essential that when equipment is installed within the chamber, the opening at the rear of the housing is closed. This may be effected by a closure member which forms no part of the housing, a slidable or pivotal housing flap, or by a closure member forming part of a detachable assembly which includes the equipment.

Alternatively, the housing according to the invention forms a first housing of a housing assembly in which a second housing is attachable to the first housing so as to close the rear opening, and the second housing defines a chamber which is separated from the chamber of the first housing. In a preferred arrangement, the second housing has an opening to a chamber and is attachable to the first housing with the openings opposing each other but with a partition located between the housing so as to separate the chambers.

Embodiments of the invention will now be described, by way of example, with reference to the accompanying drawings in which:

FIG. 1 is an isometric view of a housing assembly according to a first embodiment;

FIG. 2 is a rear isometric view of a housing forming part of the assembly of FIG. 1;

Figure 3:
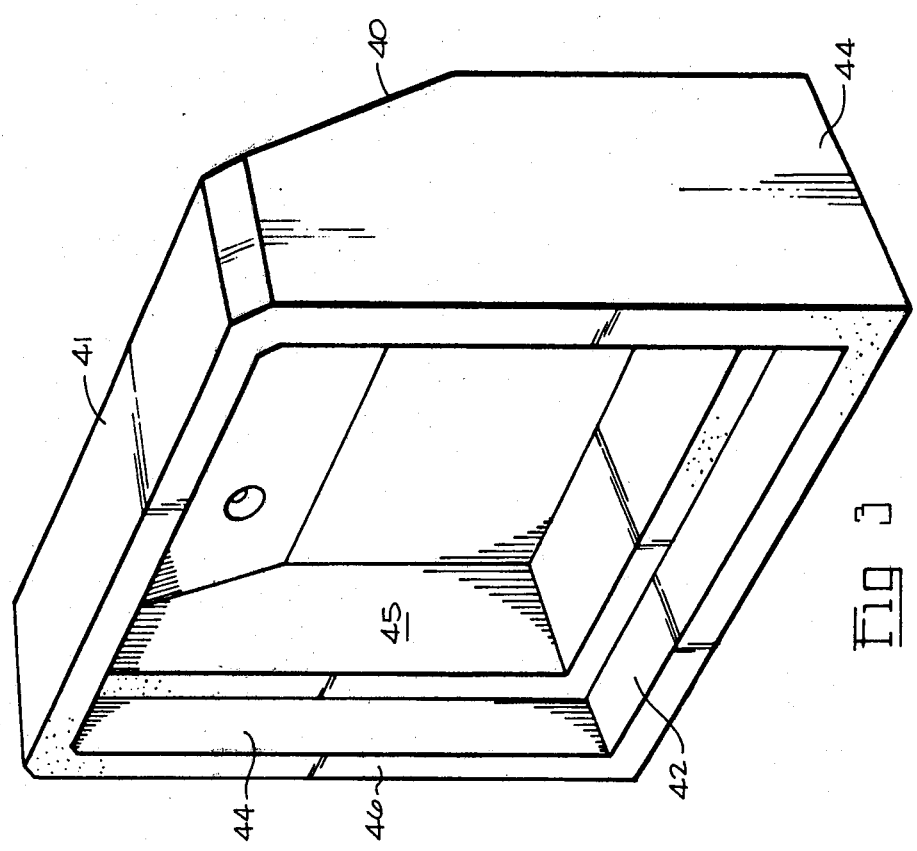
FIG. 3 is a cross-sectional view, in side elevation of an equipment assembly to be inserted within the housing of FIG. 2.

In a first embodiment, as shown in FIG. 1, a housing assembly 1 for electrical or electronic test equipment for use in testing telecommunications cables comprises two housings 2 of identical size and shape. Each housing (see FIGS. 1, 2 and 5) is formed by the centrifugal moulding of polyethylene to provide two closed sidewalls 3, base 4 and top 5, and a front wall 6 each having inner and outer spaced walls 7, 8 which are integral at edges 9. The space between the walls is filled with compressible polystyrene or polyethylene foam 10, foamed in situ by well known techniques in heat insulation or structural fields. Because of the compressibility of the foam and also that the outer wall may be distorted by resilient movement without transmitting the distortion to the inner wall, then the housing is energy absorbent for protecting electrical equipment to be carried therein from being damaged as a result of the housing being dropped.

Each housing has a rear planar face 11 which defines a rectangular opening 12 to a chamber 13 defined within the housing. The opening is surrounded by a planar narrow surface 14 which is recessed from the face 11 to act as a register for location of a partition 15 (FIG. 5) between the two housings as will be described. The front wall of each housing is inclined towards the rear face 11 as it extends upwards for reasons of stability. The sidewalls thus taper upwardly and project beyond the top wall 5 to terminate in a handle section 16 having convex surfaces 17 except at the rear face 11 where it is planar. As may be seen from FIG. 5, in the housing assembly, the housings abut at their rear faces 11 so that the handle sections join to give a completed convex handle.

The top wall of each housing is inclined towards the front wall and the base is inclined oppositely to it to decrease the cross-sectional area of the chamber 13 as it extends from the rear. To position the rear face vertically upon the ground or other horizontal support, the sidewalls extend downwardly below the base to form stub feet 18.

The front wall of each housing defines a rectangular aperture 19 extending between the sidewalls. As shown, the aperture is at or towards the top of the front wall but obviously, it could be located at any position. To close the aperture, a flap 20 is provided. The flap is hinged at its upper edge to hinge upwardly and away from the aperture. The hinge 21 is a plastic or metal rod extending through bosses 22 extending from sidewalls 3. Frictional resistance to movement of the flap is offered by the hinge to enable the flap to be located in any desired pivotal position. This enables a user of equipment contained by the housing assembly to choose a position which will prevent entry of rain into the aperture or will shade any instruments framed within the aperture while enabling the instruments to be read or manually operated.

Figure 6:
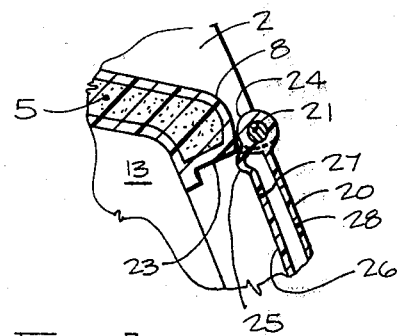
FIG. 6 is a cross-sectional view taken along line 'VI—VI' in FIG. 1.

Although because of moulding difficulties, it may be necessary for the upper aperture defining edge 23 to be inclined downwardly towards chamber 13, there is no tendency for rainwater to run into the chamber sufficiently to harm equipment. This is partly because of the manner in which the equipment is sealingly mounted within the chamber as will be described and partly because of the way in which the flap 20 is mounted. As shown in greater detail in FIG. 6, with the flap closed, its upper edge 24 lies closely against the outer wall 8 where the front wall and the top 5 of the housing merge. Also a horizontal rib 25 projects from the flap just beneath the outer wall 8 to touch the junction point between wall 8 and edge 23 and to assist in narrowing the space to penetration by rain water. If slight amounts of water enter, there is a tendency for it to run around the rib 25, down the inner surface 26 of the flap and then out of the housing and away from chamber 13. The edge 24 of the flap lies substantially on the arc of a circle, the centre being coincident with the axis of the hinge. Hence with the flap in any desired pivotal position, the edge 24 is still close to the wall 8 substantially to prevent rainwater entry.

Figure 7:
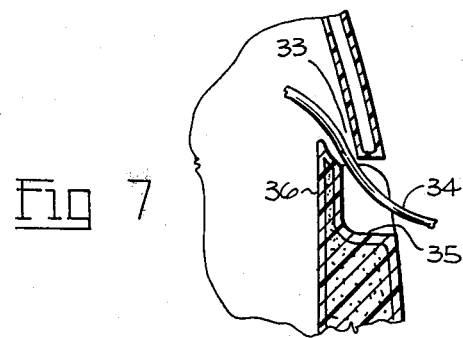
FIG. 7 is a cross-sectional view, taken along line 'VII—VII' in FIG. 1.

The inner surface 26 of the flap is formed by an inner wall 27. The flap is formed by a blow moulding process from polyethylene and also comprises an outer wall 28 spaced from the inner wall. The walls are independently resiliently movable for the purpose of adding to the shock resistance of the housing. The sides of the flap are formed with flanges 29, which when the flap is closed lie within moulded recesses 30 in sidewalls 3. As shown particularly by FIG. 1, each flap in closed position, follows closely the general outline dictated by the front and side walls of its housing. Means are provided to retain each flap in closed position. This means comprises a pip 31 projecting from the surface of each recess 30 (FIG. 1), each pip being engageable with an indent 32 (FIG. 7) in the inside of each flange 29 when the flaps are closed. Manual operation to open a flap is sufficient to cause the flap to ride over the pips.

Figure 8:
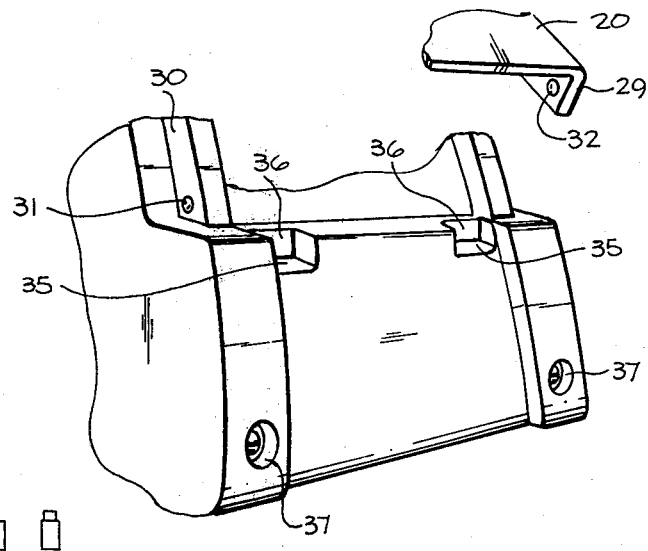
FIG. 8 is a isometric view of one part of the housing showing a detail of the first embodiment.

With the flap closing the aperture 19 of its housing, the flap and front wall define between them at least one, but in this embodiment, two gaps 33 (one being shown in FIG. 7) to enable electrical or transmission wiring (such as wires 34, FIGS. 1 and 7) to pass from chamber 13 while affording maximum protection to the equipment against weather conditions. The gaps 33 are provided by two recesses 35 moulded into the front wall directly below the aperture 19. Each recess has a back wall 36 (FIGS. 7 and 8) which ensures that each gap 33 is upwardly directly beneath the flap from outside to inside chamber 13 and prevents entry of rain.

The two housings are assembled together by the passage of lateral fixing bolts (not shown) through four pairs of aligned holes 37 in the housing. As shown in FIG. 1, a hole is provided towards the top and bottom of each sidewall, the sidewalls being sufficiently thick, e.g. from 1.00 to 1.25 inches, to accommodate the holes without loss in strength.

Electrical equipment may be mounted in any manner within the housing assembly. Preferably, the equipment is mounted within a shockproof moisture resistant surround which increases the shock and moisture resistance of the housing assembly. In a preferred construction as shown by this embodiment in FIGS. 3 and 4, electrical test equipment 38 is in the form of a printed circuit board 39 with associated components. The equipment is mounted within a compressible closed cell foam surround 40. The surround has a top wall 41, bottom wall 42, and front and side walls 43, 44 defining a chamber 45 open at the rear 46. The outside shape and dimensions of the surround is such that it may be mounted within chamber 13 of one of the housings while engaging the inner walls of the housing substantially intimately to prevent movement.

Figure 4:
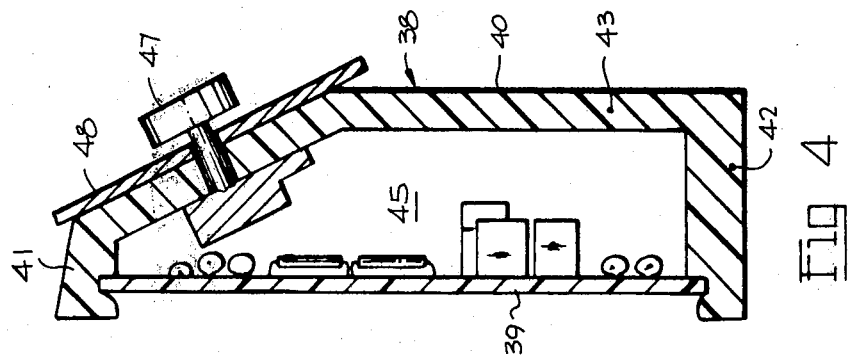
FIG. 4 is a rear isometric view of a shock absorbing surround forming part of the equipment assembly.

The circuit board 39 has outside dimensions slightly greater than the chamber 45 in planes parallel to its rear 46. The board is mounted within the surround 40 by manually forcing it into the chamber such that the board outwardly engages and compresses the foam of the walls of the surround as shown in FIG. 4 and the manner described in pending patent application entitled "Electric Test Equipment Mounting", Ser. No. 104,886, filed Dec. 18, 1979, and in the name of Clifford Dean Read. The test equipment also includes components such as switch 47 and measurement instruments (not shown) which project to or through the front wall 43 of the surround. These are sealed into close fitting holes formed in the foam possibly by rubber '0' rings but water repellant grease such as silicone grease disposed in the holes is useful for this purpose. A metal face plate 48 is adhesively secured to an inclined section of the front wall 43 further to seal the surround 40 and holes are formed in the plate in alignment with visual measurement instruments or for passage of switches 47.

Figure 5:
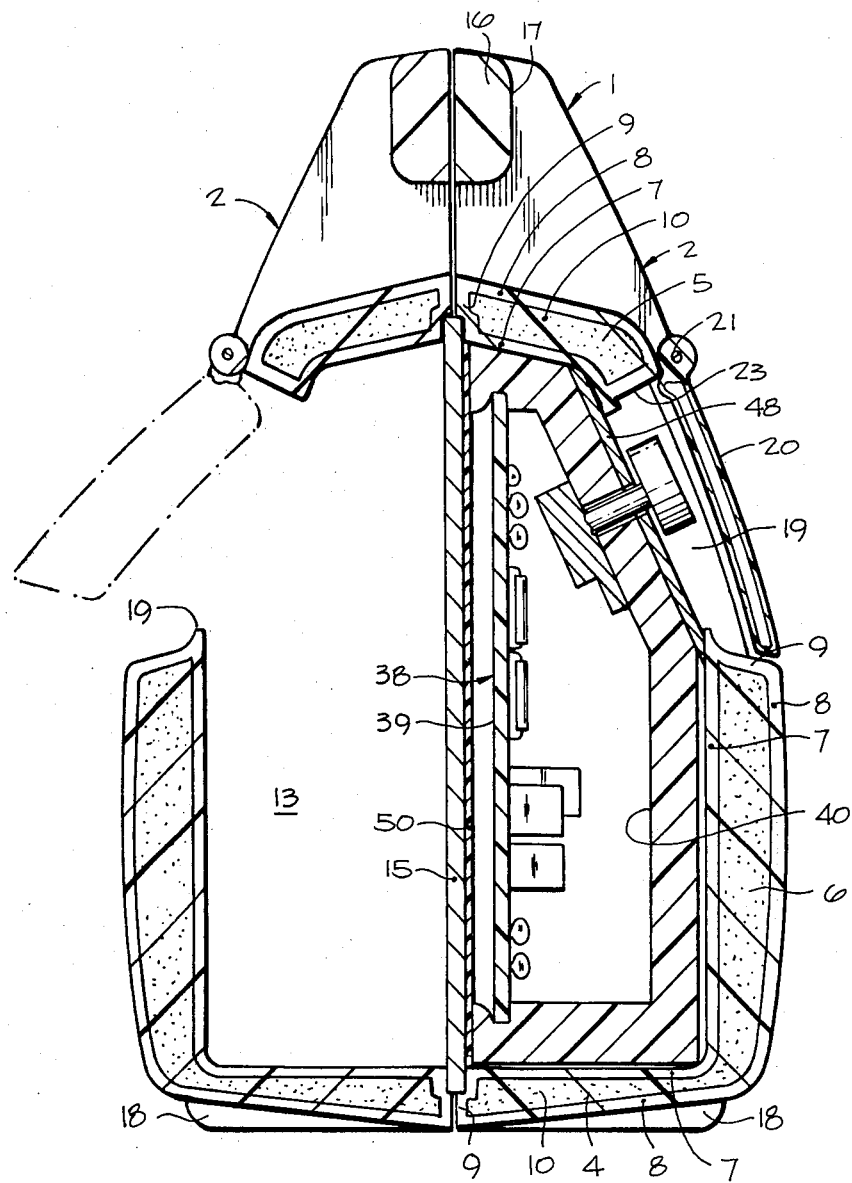
FIG. 5 is a cross-sectional view, in side elevation, of the housing assembly of FIG. 1 and including the equipment assembly of FIG. 3.

In the complete assembly as shown by FIG. 5, the equipment 38 mounted within the foam surround 40 is inserted into chamber 13 through the opening 12 in the one housing. In its mounted position, the metal plate 48 fills the inside of aperture 19 to engage the inner wall 7 of the housing. Thus with the flap 20 raised, the instruments and switches are accessible for reading or manual operation.

With the equipment mounted within one chamber 13, the metal partition 15 is located between the chamber and lies in register with the recessed surface 14 of each housing. To seal the equipment completely, a foam sheet 50 which may be neoprene, is disposed between the partition 15 and the surround 40 over the opening at its rear 46. The thickness of the partition is slightly greater than the total depth of the recessed surfaces 14 when the housings are bolted together so that the foam sheet 50 is compressed against the surround 40 which is, in turn, firmly bedded into chamber 13 and against the inner wall of the housing.

Hence, the housings do not abut at their rear faces but are spaced slightly by the partition. While one chamber 13 contains the equipment 39, the other chamber is separated from it by the partition and may be used for storage of, for instance, earphones or a telephone base and/or handset. To remove these, the flap of the housing containing them is raised and may be closed again with any wiring passing through a gap 33. This operation does not interfere with the equipment in the other chamber 13.

The construction of the housing assembly makes it stable for standing upon the stub feet 18. The instruments may be read and operated with the associated flap raised to any chosen position to prevent rain from blowing into the aperture 19. In addition, the construction is such that the equipment is substantially completely sealed from ambient moisture. As already discussed, any water running between the flap top edge and the housing, tends to flow down the inside of the flap and away from the equipment particularly with the flap closed. If any traces of water do reach the chamber, the closed cell foam surround 40 prevents it from reaching the equipment. In one test, the complete assembly was immersed in water for a few minutes before any water was able to get into the surround itself. Further to this, the housings are shock absorbent and greatly resist damage being caused to the equipment by dropping the assembly.

All of the above advantages are obtained even though the removal and replacement of equipment is an easy and fast operation.

What is claimed is:

1. A housing for electrical or electronic test equipment made from waterproof material, having inner and outer skin layers which are relatively resiliently movable upon application of pressure, defining a chamber for containing electrical or electronic test set equipment and comprising a closed top, two sidewalls and a base, a rear defining an opening to admit the equipment into the chamber, and a front wall defining an aperture to the chamber, and a flap on said housing for closing the aperture, the flap being hinged at an upper edge for upward hinging movement away from the aperture.

2. A housing according to claim 1 comprising means closing the opening in the rear wall.

3. A housing according to claim 1 wherein the hinge offers frictional resistance to movement of the flap to enable the flap to be located in any pivotal position.

4. A housing according to claim 1 wherein when the flap is in a position closing the aperture, the front wall and the flap define between them at least one gap to enable electrical or transmission wiring to pass through from the chamber.

5. A housing assembly comprising a first housing according to claim 1 and a second housing, the second housing being attached to the first housing so as to close the rear opening, the second housing defining a chamber which is separated from the chamber of the first housing.

6. An assembly according to claim 5 wherein the second housing has an opening to its chamber and is attached to the first housing with the two openings opposing one another, and a partition is provided which is located between the housings.

7. An assembly according to claim 6 including electrical test equipment in the chamber of the first housing, the equipment being detachably mounted within the first housing and having electrical instruments located in line with the aperture for viewing with the flap pivoted upwards.

8. An assembly according to claim 7 wherein the equipment is mounted within a shock absorbing moisture resistant surround which is detachable with the equipment from the chamber.

9. An assembly according to claim 8 wherein the surround has a top wall, bottom wall and front and side walls contacting respective walls of the first housing, the surround also defining a rear opening for insertion and removal of the equipment and the partition is sealed to the surround around the surround rear opening.

10. A combination according to claim 1 wherein a compressible foam is located between the skin layers.

11. A combination according to claim 5 wherein the housings are of identical size and shape.

12. A housing and electrical or electronic test equipment assembly comprising a housing made from waterproof material comprising a closed top, two sidewalls and a base defining a chamber, a rear defining an opening to admit the equipment into the chamber, and a front wall defining an aperture to the chamber, a flap on said housing for closing the aperture, the flap being hinged at an upper edge for upward hinging movement away from the aperture, electrical or electronic test set equipment in the chamber of the housing, the equipment having electrical instruments located in line with the aperture for viewing with the flap pivoted upwards, a shock absorbing moisture resistant surround containing the equipment and being detachable with the equipment from the chamber, the surround having a top wall, bottom wall and front and side walls contacting respective walls of the housing, the surround also defining a rear opening for insertion and removal of the equipment, and a partition which is sealed to the surround around the surround rear opening.

* * * * *